(12) United States Patent
Tsai

(10) Patent No.: US 10,423,198 B1
(45) Date of Patent: Sep. 24, 2019

(54) CASING

(71) Applicants: INVENTEC (PUDONG) TECHNOLOGY CORPORATION, Shanghai (CN); INVENTEC CORPORATION, Taipei (TW)

(72) Inventor: Hui-Ming Tsai, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/219,210

(22) Filed: Dec. 13, 2018

(30) Foreign Application Priority Data

Oct. 11, 2018 (CN) .......................... 2018 1 1184222

(51) Int. Cl.
| G06F 1/16 | (2006.01) |
| H05K 5/00 | (2006.01) |
| H05K 7/00 | (2006.01) |
| G06F 1/18 | (2006.01) |
| H05K 7/14 | (2006.01) |
| H05K 5/02 | (2006.01) |

(52) U.S. Cl.
CPC .......... G06F 1/187 (2013.01); H05K 5/0226 (2013.01); H05K 7/1489 (2013.01)

(58) Field of Classification Search
CPC . G06F 1/18; G06F 1/181; G06F 1/183; G06F 1/187; H05K 5/0226; H05K 7/1489

USPC ........................................ 361/679.31–679.39
See application file for complete search history.

(56) References Cited

U.S. PATENT DOCUMENTS

| 8,807,488 | B2* | 8/2014 | Lee | .......................... G06F 1/187 |
| | | | | 248/222.51 |
| 8,976,536 | B2* | 3/2015 | French, Jr. | ........... H05K 7/1427 |
| | | | | 16/221 |
| 9,443,559 | B2* | 9/2016 | Jau | ..................... H05K 13/0084 |
| 10,212,840 | B2* | 2/2019 | Kuan | ................... H05K 7/1489 |

* cited by examiner

Primary Examiner — Anthony M Haughton
(74) Attorney, Agent, or Firm — Maschoff Brennan

(57) ABSTRACT

This disclosure relates to casing, including tray, first pivot, guiding component, housing box and handle. The tray has bottom surface and first side surface. The first pivot is fixed on the first side surface. The guiding component disposed on the first side surface includes distal opening and base closed end, which is closer to the bottom surface than the distal opening and located between the distal opening and the first pivot. The housing box includes first side and second side. The first side is pivotably disposed at the first pivot, and the second side has insertion opening. The housing box has second side surface located between the first side and the second side. The handle pivotably disposed on the second side surface includes hold part and pin. The guiding component is located between the hold part and the first pivot. The pin is located at the base closed end.

10 Claims, 10 Drawing Sheets

US 10,423,198 B1

CASING

CROSS-REFERENCE TO RELATED APPLICATIONS

This non-provisional application claims priority under 35 U.S.C. § 119(a) on Patent Application No(s). 201811184222.8 filed in China, P.R.C. on Oct. 11, 2018, the entire contents of which are hereby incorporated by reference.

TECHNICAL FIELD

The present disclosure relates to a casing, more particularly to a casing having a pivotable housing box for HDDs.

BACKGROUND

A server usually accommodates a large number of hard disks for storing a large amount of data. These hard disks are closely arranged in a server case so as to make the most of space inside the server case. In some cases, the hard disks are disposed on a tray slidably disposed in the server case. Therefore, the user can draw the tray out of the server case and then to detach or install the hard disks. In addition, the hard disks may be disposed in a housing box which is pivotably disposed in the tray. When the housing box is pivoted in an inclined manner, the hard disks are in a position that is convenient to be removed or installed, thereby increasing the efficiency of replacing the hard disks.

SUMMARY

According to one aspect of the present disclosure, a casing includes a tray, a first pivot, a guiding component, a housing box and a handle. The tray has a bottom surface and a first side surface adjacent to each other. The first pivot is fixed on the first side surface. The guiding component is disposed on the first side surface and includes a distal opening and a base closed end, which is closer to the bottom surface than the distal opening and is located between the distal opening and the first pivot. The housing box includes a first side and a second side opposite to each other. The first side is pivotably disposed at the first pivot, and the second side has an insertion opening. The housing box has a second side surface located between the first side and the second side. The handle is pivotably disposed on the second side surface and includes a hold part and a pin. The guiding component is located between the hold part and the first pivot, and the pin is located at the base closed end.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
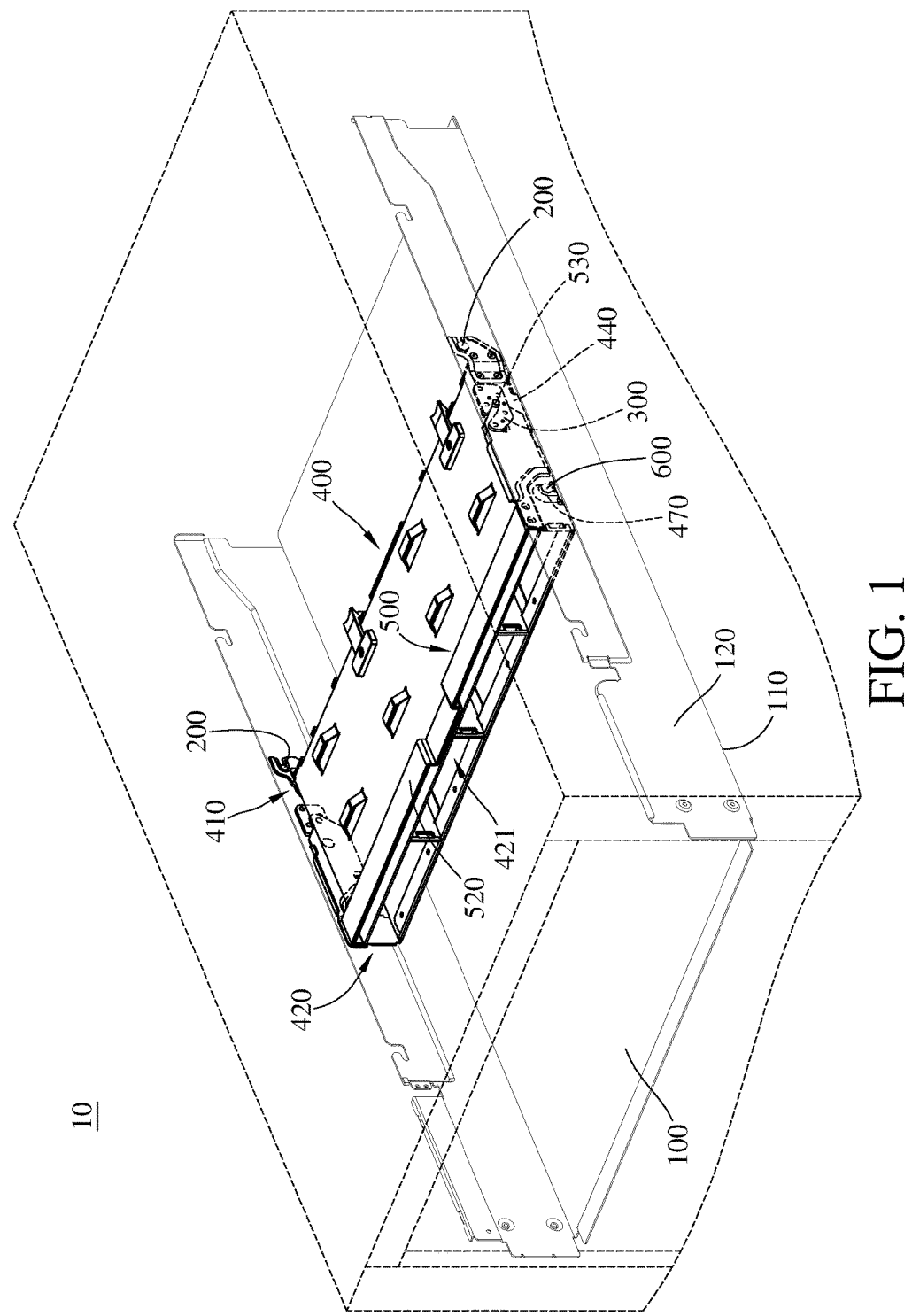
FIG. 1 is a perspective view of a casing according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
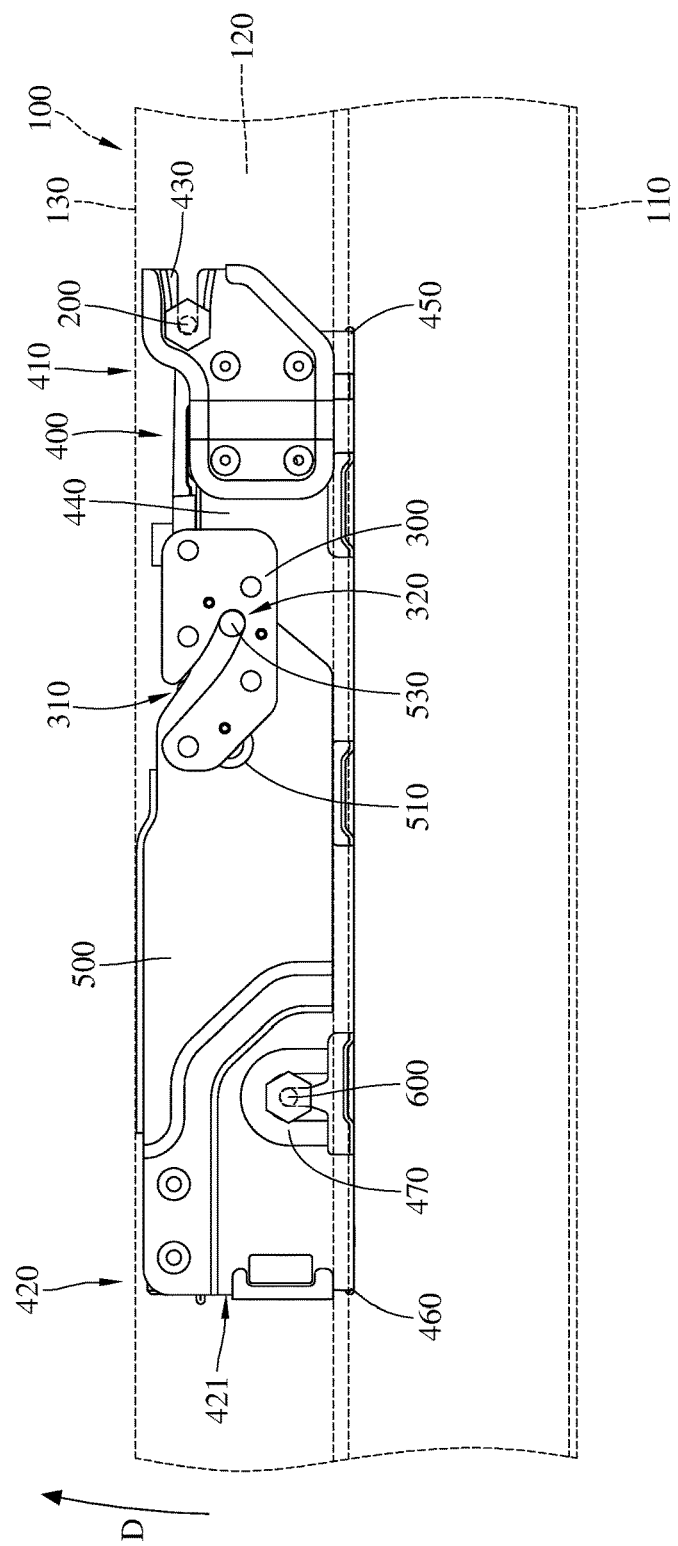
FIG. 2 is a partially enlarged side view of the casing in FIG. 1.

Please refer to FIG. 1 and FIG. 2, FIG. 1 is a perspective view of a casing according to one embodiment of the present disclosure, and FIG. 2 is a partially enlarged side view of the casing in FIG. 1.

In this embodiment, a casing 10 (e.g., a server cabinet) includes a tray 100, at least one first pivot 200, at least one guiding component 300, a housing box 400 and a handle 500. The tray 100 has a bottom surface 110 and a first side surface 120 adjacent to each other. The casing 10 may be placed on a platform (e.g., a table) in a way that the bottom surface 110 of the tray 100 faces the platform. The first pivot 200 is fixed on the first side surface 120. The guiding component 300 is disposed on the first side surface 120. The guiding component 300 includes a distal opening 310 and a base closed end 320. The base closed end 320 is closer to the bottom surface 110 than the distal opening 310 and is located between the distal opening 310 and the first pivot 200.

Figure 3:
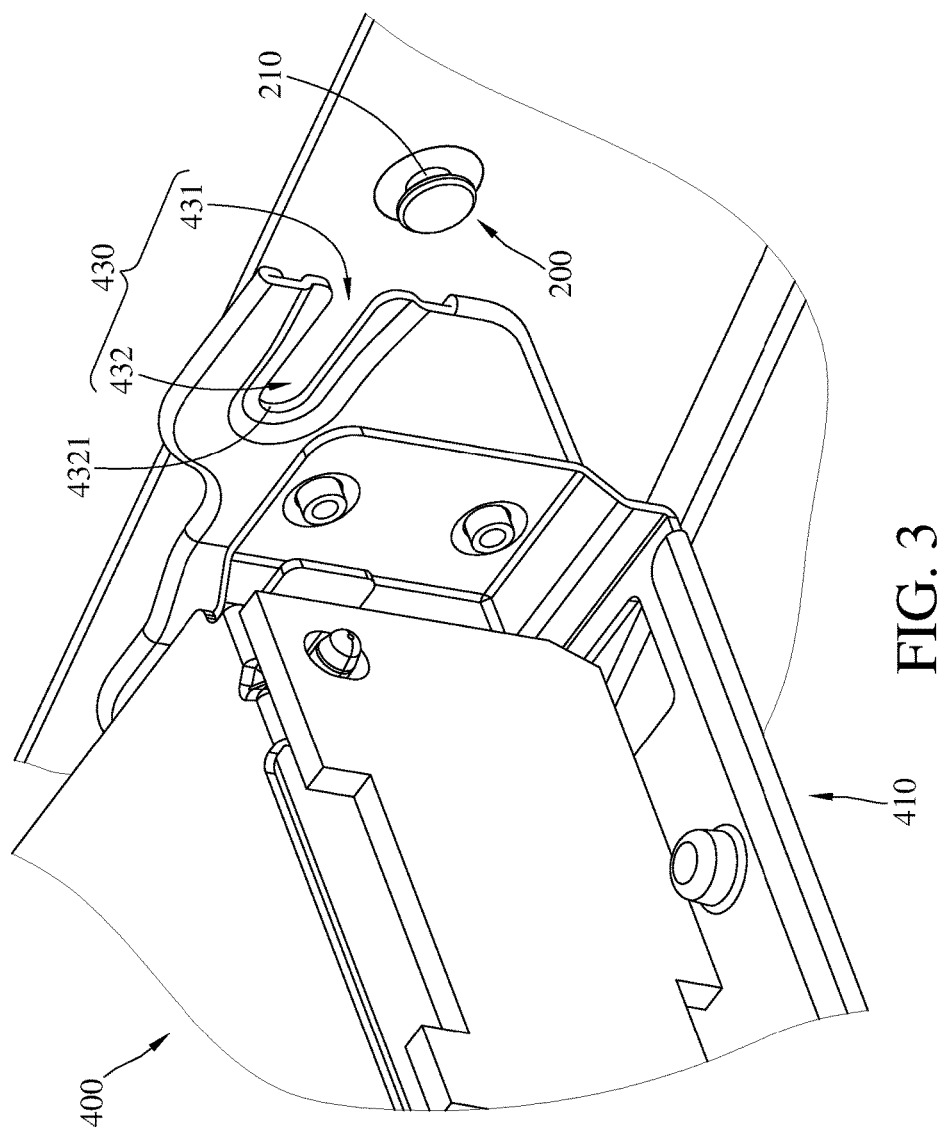
FIG. 3 is a partially enlarged exploded view of the casing in FIG. 1.

The housing box 400 includes a first side 410 and a second side 420 opposite to each other. The first side 410 is pivotably disposed at the first pivot 200. Please refer to FIG. 3, which is a partially enlarged exploded view of the casing in FIG. 1. In this and some embodiments of the present disclosure, the hosing box 400 includes a first slot 430 located at the first side 410 of the housing box 400. The first slot 430 includes a first opening 431 and a first closed end 432. The first pivot 200 can be placed into the first slot 430 via the first opening 431 and thus sliding along the first slot 430 and contacting a first inner surface 4321 of the first closed end 432 with a first outer surface 210 of the first pivot 200. As such, the housing box 400 is able to be pivotably disposed in the tray 100 via the first slot 430 and pivotable about the first pivot 200. However, the disclosure is not limited thereto; in some other embodiments, the housing box may be disposed into the tray by screwing.

Figure 4:
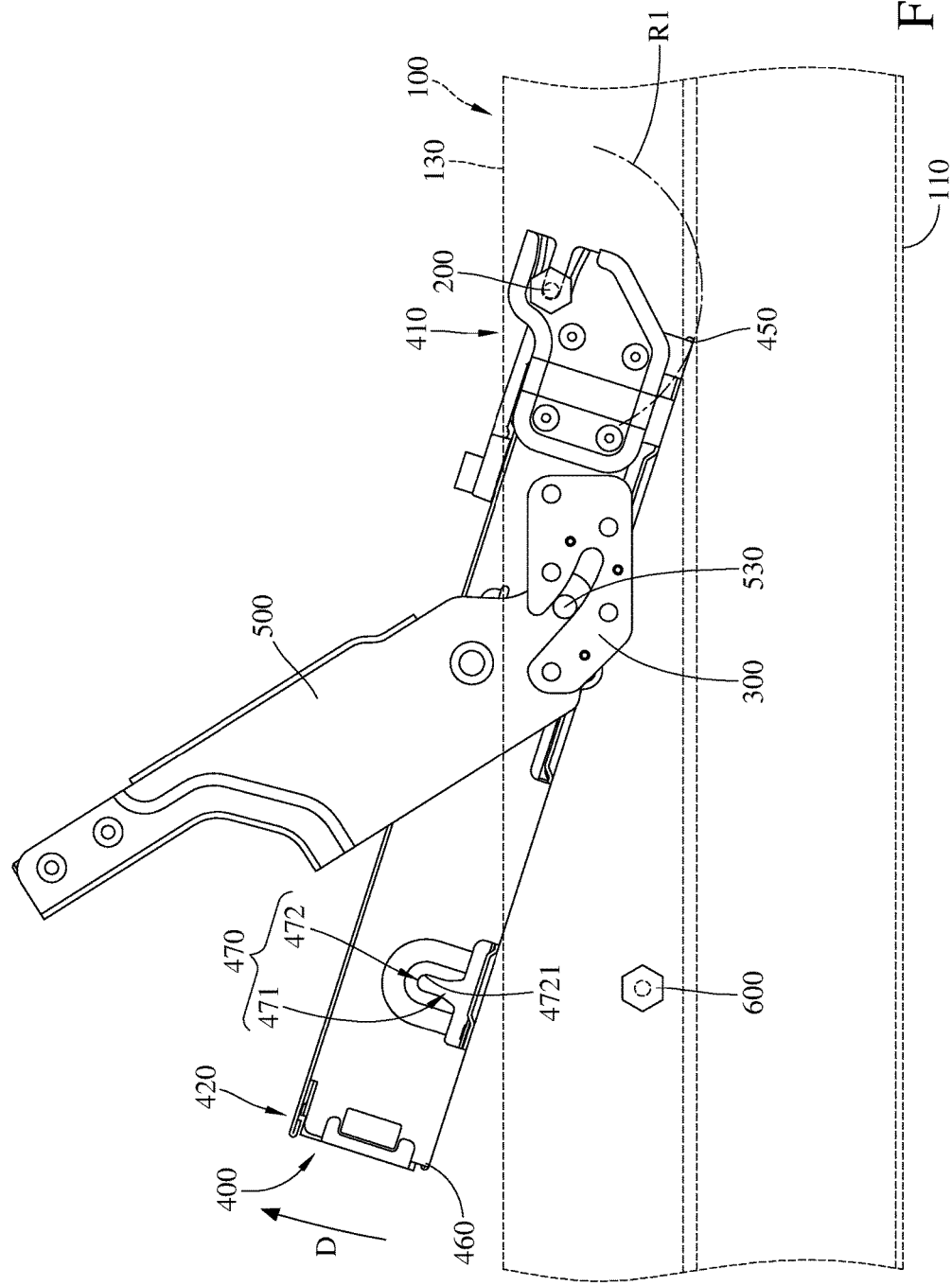
FIG. 4 is a partially enlarged side view showing that a housing box and a handle of the casing is pivoted with respect to a tray.

Please refer to FIG. 1, FIG. 2 and FIG. 4, FIG. 4 is a partially enlarged side view showing that a housing box and a handle of the casing is pivoted with respect to a tray. In this embodiment, the housing box 400 has an insertion opening 421 located at the second side 420. One or more electrical components (e.g., hard disks, but not shown in the figures) can be inserted into or removed from the housing box 400 via the insertion opening 421. The housing box 400 has a second side surface 440 located between the first side 410 and the second side 420. The second side surface 440 faces the first side surface 120 of the tray 100. The handle 500 includes a pivot part 510, a hold part 520 and a pin 530. The pivot part 510 is pivotably disposed on the second side surface 440. The guiding component 300 is located between the hold part 520 and the first pivot 200. When the housing box 400 is placed in the tray 100, the pin 530 is located at the base closed end 320 of the guiding component 300 and is supported by the guiding component 300. When the handle 500 is pivoted, the pin 530 is able to be slid toward the base closed end 320 or the distal opening 310.

Since the base closed end 320 is closer to the bottom surface 110 than the distal opening 310 and is located between the distal opening 310 and the first pivot 200, the housing box 400 can be pivoted by pivoting the handle 500 so as to move the second side 420 of the housing box 400 in a direction D away from the bottom surface 110.

In addition, in this and some embodiments of the present disclosure, the housing box 400 has a first corner 450 which has, for example, a right angle or an acute angle. In some other embodiments, the housing box may have a rounded corner or a beveled corner. In this and some embodiments of the present disclosure, the first corner 450 is located at the first side 410 of the housing box 400 and close to the bottom surface 110. While the housing box 400 is pivoted about the first pivot 200 in the direction D, the first corner 450 is moved along an arc path R1 which does not overlap with the bottom surface 110 of the tray 100. Accordingly, while the housing box 400 pivoted with respect to the tray 100, the housing box 400 does not interfere with the bottom surface 110.

Figure 5:
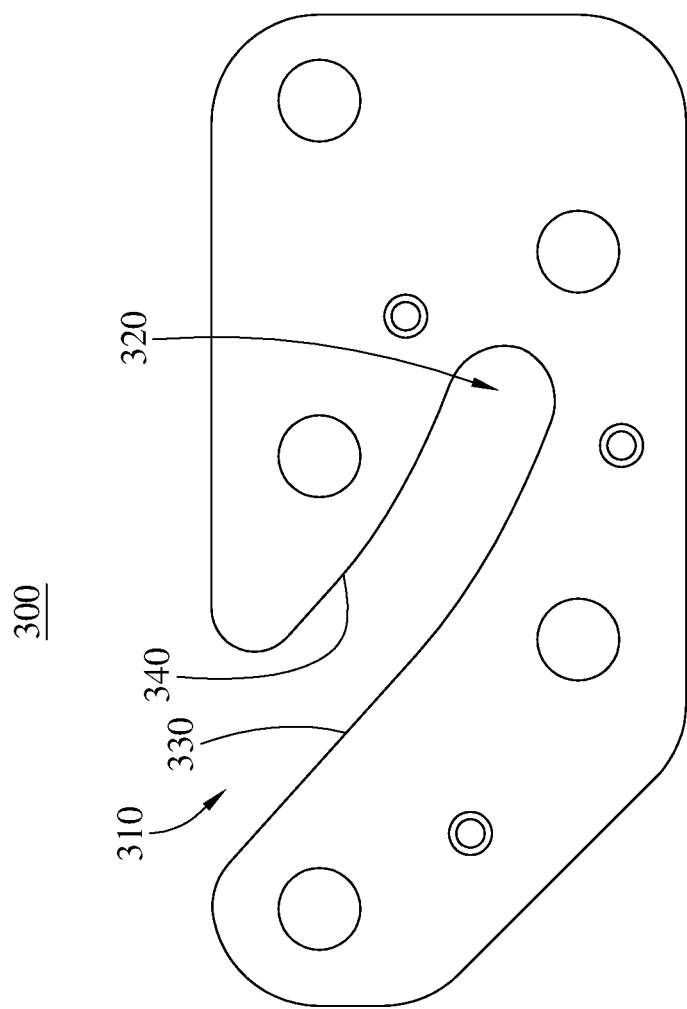
FIG. 5 is a front view of a guiding component of the casing in FIG. 1.

Please refer to FIG. 4 to FIG. 5, and FIG. 5 is a front view of a guiding component of the casing in FIG. 1. In this and some embodiments of the present disclosure, the guiding component 300 has a first guide surface 330 that is a continuous surface located between and connected to the distal opening 310 and the base closed end 320. The first guide surface 330 has a mild curve, allowing the pin 530 to slide in a smooth manner, but the disclosure is not limited thereto. In some other embodiments, the first guide surface may have a plurality of flat surfaces located between and connected to the distal opening and the base closed end, so long as the pin can slide in a smooth manner.

The guiding component 300 further has a second guide surface 340 that is opposite to the first guide surface 330. The second guide surface 340 is also a continuous surface located between and connected to the distal opening 310 and the base closed end 320. The second guide surface 340 has a mild curve, allowing the pin 530 to slide in a smooth manner, but the disclosure is not limited thereto. In some other embodiments, the second guide surface may have a plurality of flat surfaces located between and connected to the distal opening and the base closed end, so long as the pin can slide in a smooth manner. As discussed above, it is noted that the first and second guide surfaces 330 and 340 are able to guide the handle 500 to be pivoted in the direction D in a smooth manner.

In this and some embodiments of the present disclosure, the distal opening 310 is wider than the base closed end and the diameter of the pin 530. Accordingly, the pin 530 is easy to enter the guiding component 300 from the distal opening 310. In some other embodiments, a width of the distal opening may be equal to a width of the base closed end and the diameter of the pin, so long as the pin can slide between the distal opening and the base closed end in a smooth manner.

Please refer to FIG. 2, in this and some embodiments of the present disclosure, the housing box 400 has a second corner 460 located at the second side 420 of the housing box 400 and close to the bottom surface 110. The tray 100 has a top side 130 located at a side of the first side surface 120 away from the bottom surface 110. As FIG. 4 shown, when the housing box 400 is pivoted in the direction D by the handle 500, and the pin 530 is moved to the distal opening 310, the second side 420 of the housing box 400 protrudes from the top side 130 of the tray 100, and the second corner 460 is moved further away from the bottom surface 110 than the top side 130. As a result, the insertion opening 421 is in a position that is convenient for the insertion and removal of the hard disks. In some other embodiments, when the pin is moved to the distal opening, the second corner may be located between the top side and the bottom surface, so long as the insertion opening is convenient for the insertion and removal of the hard disks without interfering other components.

Please refer to FIG. 1, FIG. 2 and FIG. 4, in this and some embodiments of the present disclosure, the casing 10 further includes at least one second pivot 600 fixed on the first side surface 120. The pin 530 is located between the first pivot 200 and the second pivot 600. The housing box 400 further includes a second slot 470 located at the second side 420 of the housing box 400. The second slot 470 includes a second opening 471 and a second closed end 472. The second pivot 600 can be placed into the second slot 470 via the second opening 471 and thus sliding along the second slot 470 and contacting a second inner surface 4721 of the second closed end 472 with a second outer surface 610 of the second pivot 600. As such, the housing box 400 is able to be disposed on the second pivot 600 via the second slot 470. The second pivot 600, first pivot 200, and guiding component 300 can support the housing box 400 together. However, the second pivot 600 is optional; in some other embodiments, the casing may have no second pivot 600.

Figure 6:
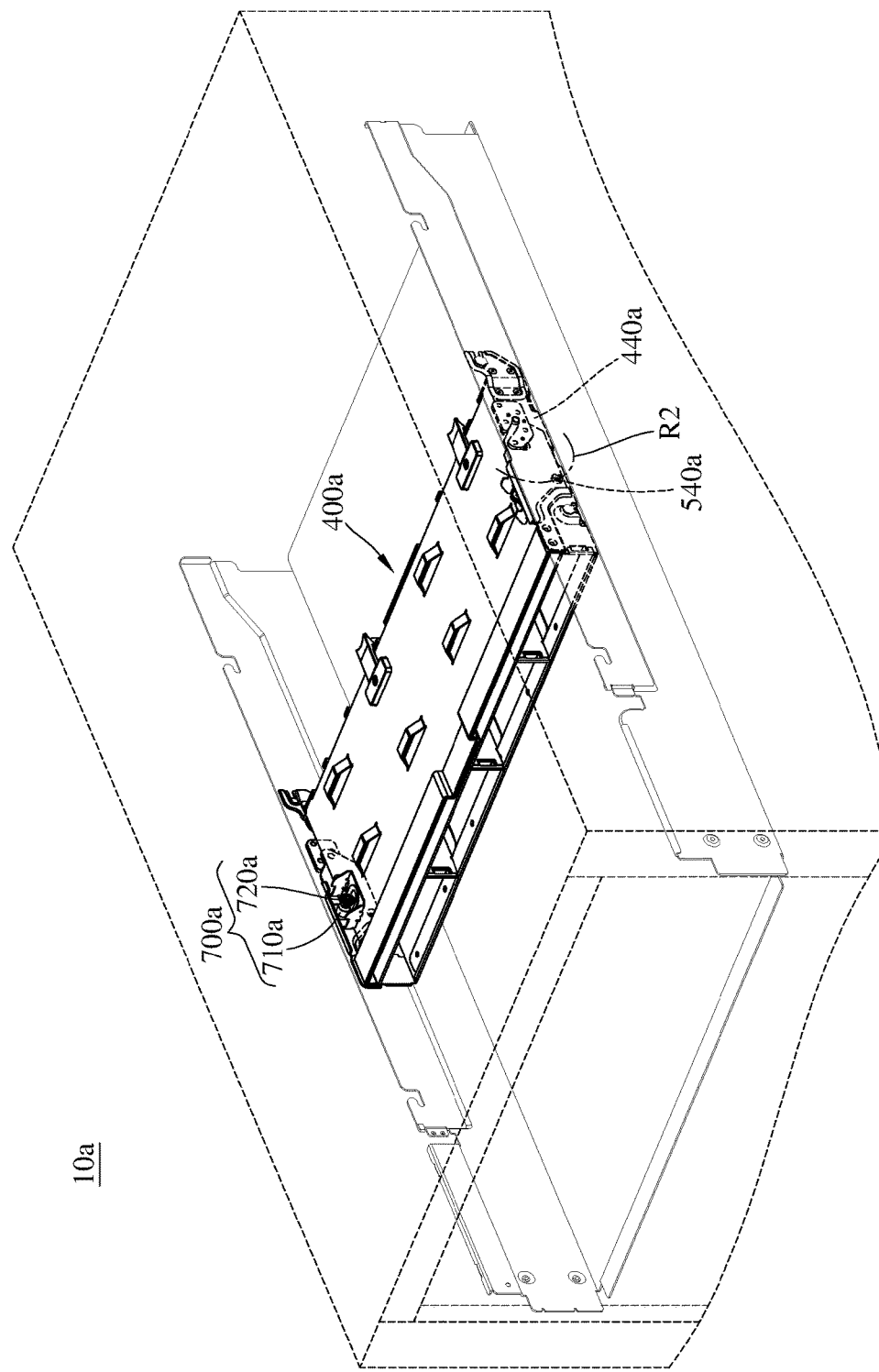
FIG. 6 is a perspective view of a casing according to another embodiment of the present disclosure.
Figure 7:
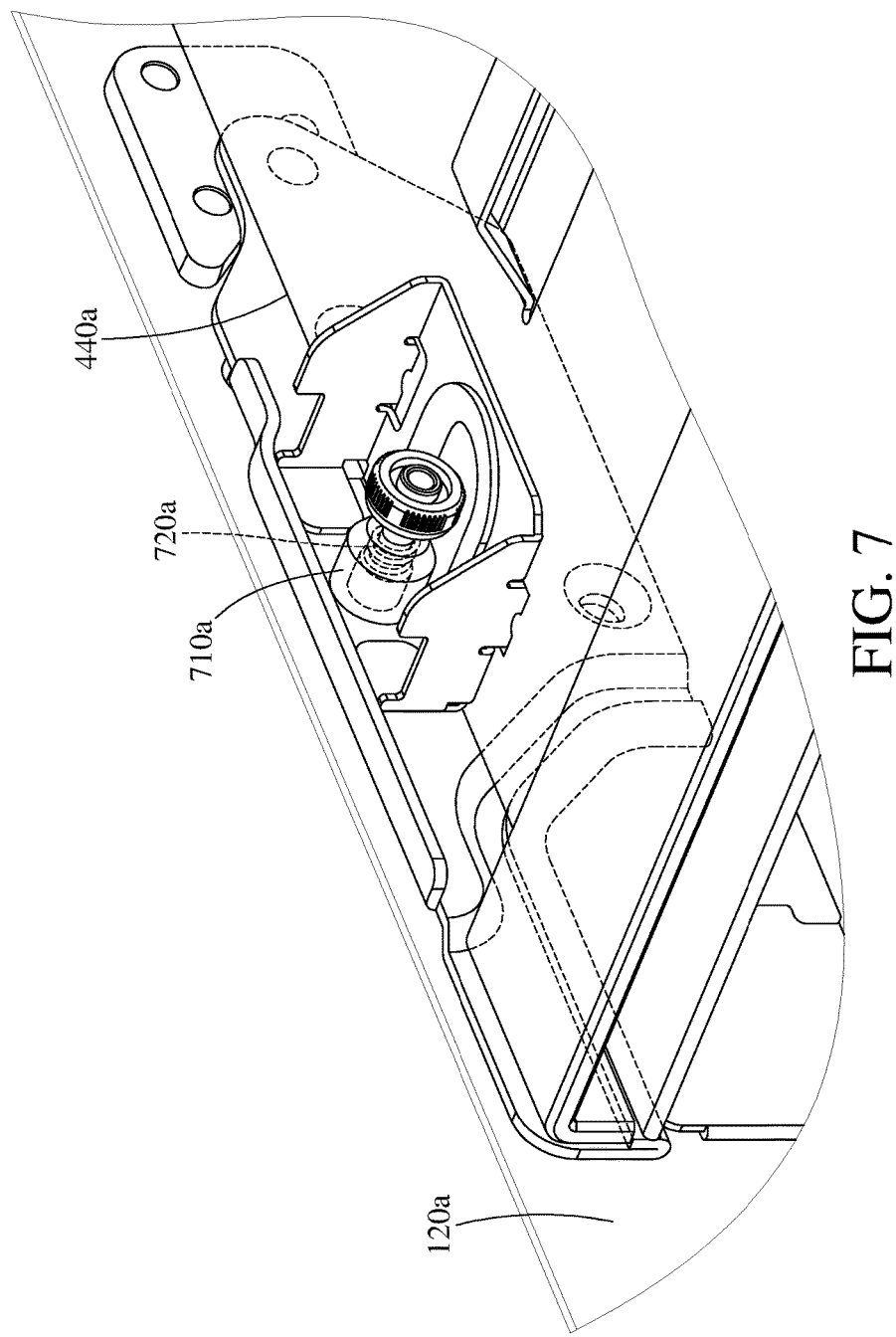
FIG. 7 is a partially enlarged view of an elastic component of the casing in FIG. 6 in a released state.
Figure 8:
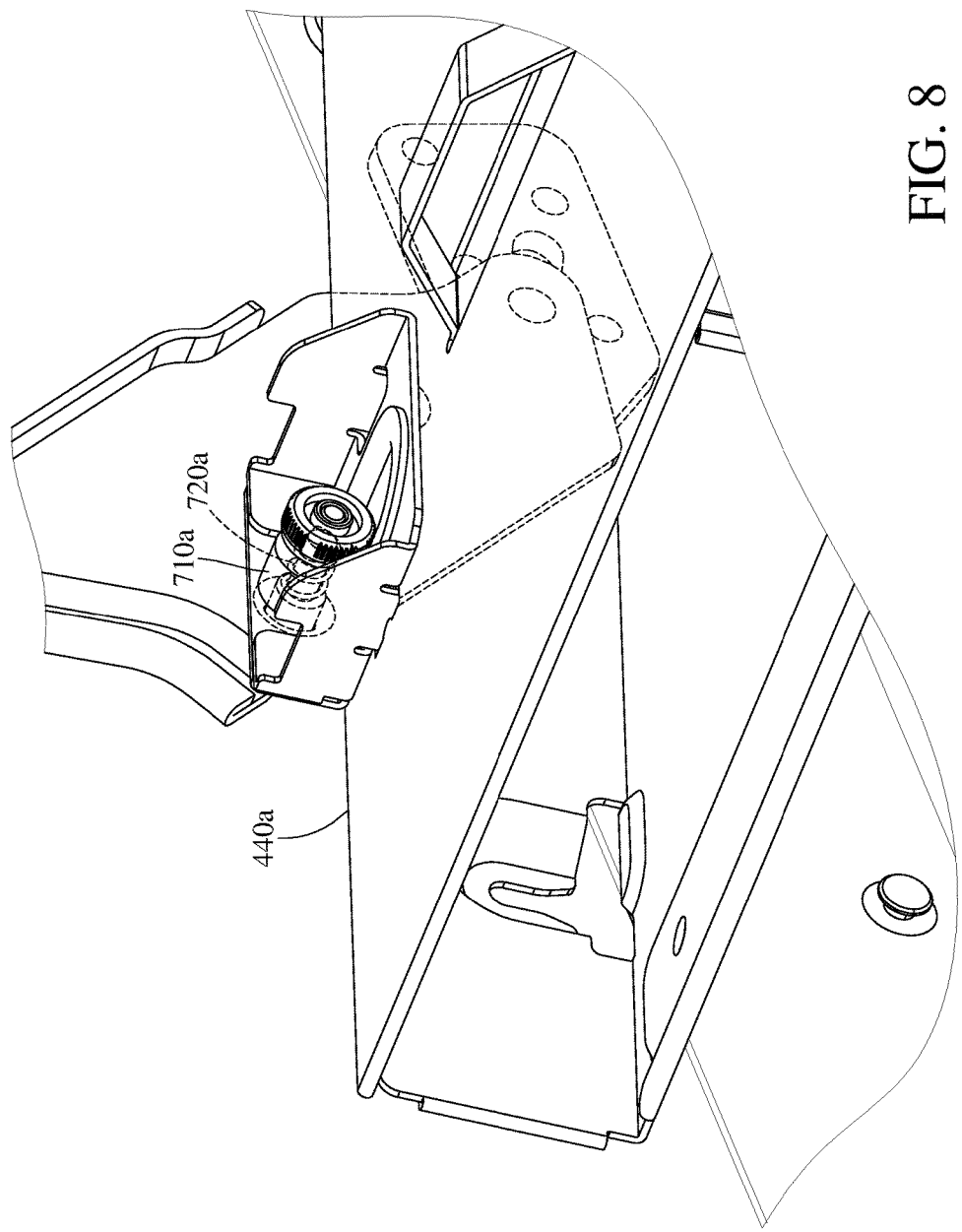
FIG. 8 is a partially enlarged view of the elastic component in a compressed state.

Please refer to FIG. 6, which is a perspective view of a casing according to another embodiment of the present disclosure. It is noted that only the differences from the preceding embodiments are explained below. In this and some embodiments of the present disclosure, a casing 10*a* further includes a positioning mechanism 700*a* disposed on a housing box 400*a*. The positioning mechanism 700*a* includes a positioning pin 710*a* and an elastic component 720*a*. The elastic component 720*a* (e.g., a coil spring) is connected to the positioning pin 710*a* and has a released state and a compressed state. Please refer to FIG. 7 to FIG. 8, FIG. 7 is a partially enlarged view of an elastic component of the casing in FIG. 6 in a released state, and FIG. 8 is a partially enlarged view of the elastic component in a compressed state. When the elastic component 720*a* is in the released state, the elastic component 720*a* forces the positioning pin 710*a* to protrude from the second side surface 440*a*. When the elastic component 720*a* is compressed to the compressed state, the positioning pin 710*a* moves with the elastic component 720*a* and thus moving away from the first side surface 120*a* and retreats to a position that is not protruding from the second side surface 440*a*. In some other embodiments, the positioning mechanism may have no elastic component, and the positioning pin may be a screw.

Please refer to FIG. 6, in this and some embodiments of the present disclosure, the handle 500*a* has a first positioning hole 540*a*. While the handle 500*a* is pivoted with respect to the second side surface 440*a*, the first positioning hole 540*a* is moved along a curved path R2 and the positioning pin 710*a* is located on the curved path R2. Please refer to FIG.

9, which is a perspective view showing that a housing box and a handle of the casing in FIG. 6 is pivoted with respect to a tray. While the housing box 400a is pivoted by the handle 500a and the first positioning hole 540a is aligned with the positioning pin 710a, the elastic component 720a is not pressed by the handle 500a and thus turning into the released state so that a part of the positioning pin 710a is able to be inserted into the first positioning hole 540a, thereby fixing the housing box 400a in the current position and making it unable to be pivoted with respect to the handle 500a. Therefore, the insertion opening 421a is held in the position convenient for the insertion and removal of the hard disks. In some other embodiments, the second side of the housing box may be raised by a lever, and the lever is also able to hold the housing box in a fixed position.

Figure 9:
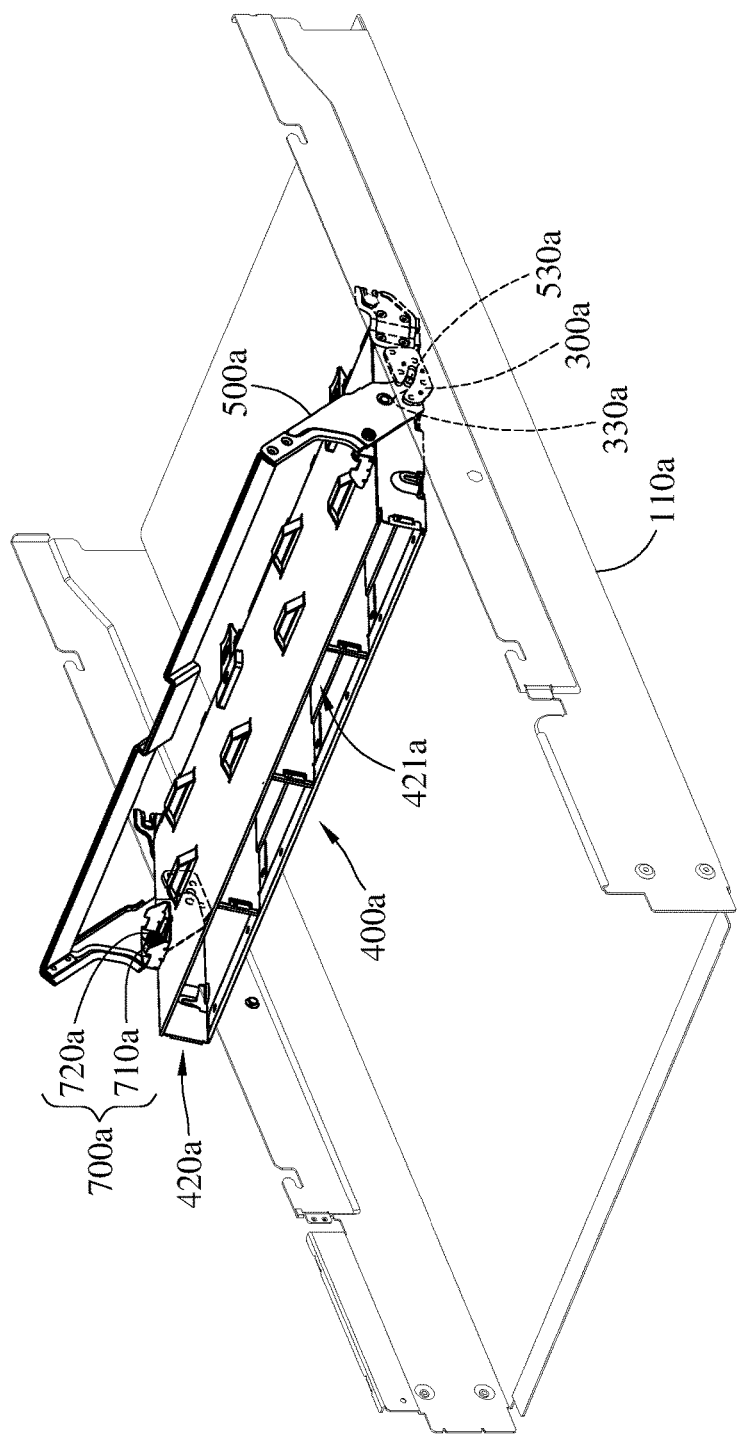
FIG. 9 is a perspective view showing that a housing box and a handle of the casing in FIG. 6 is pivoted with respect to a tray.
Figure 10:
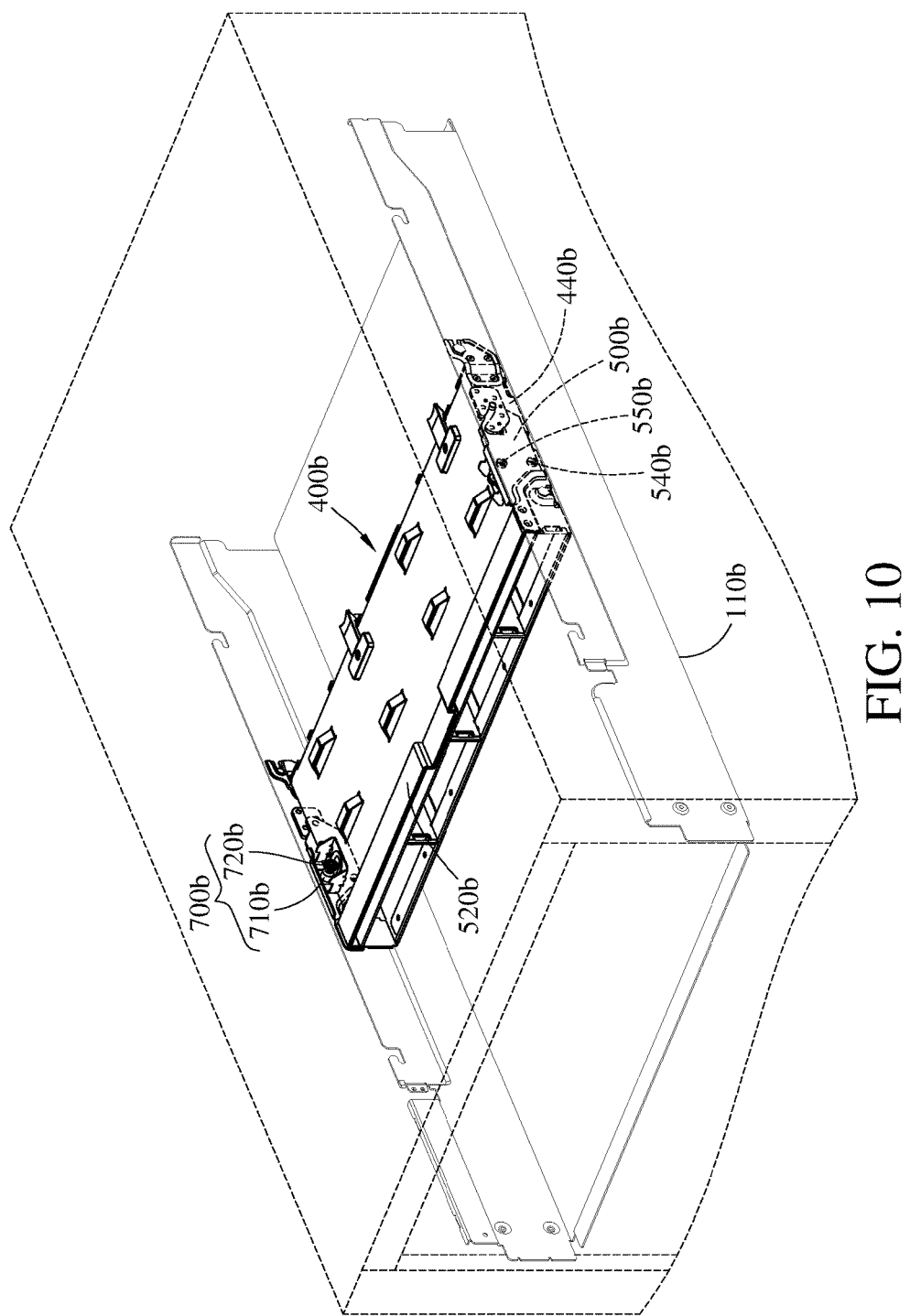
FIG. 10 is a perspective view of a casing according to still another embodiment of the present disclosure.

Please refer to FIG. 10, which is a perspective view of a casing according to still another embodiment of the present disclosure. It is noted that only the differences from the preceding embodiments are explained below. In this and some embodiments of the present disclosure, the handle 500b further has a second positioning hole 550b. A distance between the second positioning hole 550b and the bottom surface 110b is larger than a distance between the first positioning hole 540b and the bottom surface 110b. When the housing box 400b is placed in the tray 100b, the elastic component 720b is in the released state and a part of the positioning pin 710b is inserted into the second positioning hole 550b, allowing the housing box 400b is unable to be pivoted with respect to the handle 500b. Thus, the elastic component 720b can be compressed and returns to the compressed state so that the positioning pin 710b is able to retreat to a position that is not protruding from the second side surface 440b, thereby the housing box 400b can be pivoted with respect to the handle 500b. The positioning pin 710b is pressed by the handle 500b and the elastic component 720b is still in the compressed state until the first positioning hole 540b is aligned with the positioning pin 710b, and the elastic component 720b is allowed to return to the released state and a part of the positioning pin 710b inserts into the first positioning hole 540b as FIG. 9 shown. The second positioning hole 550b is configured to ensure the housing box 400b to remain locating in the tray 100b, but the disclosure is not limited thereto. In some other embodiments, there may be a supporting component pressing to the housing box, allowing the housing box is unable to pivot with respect to the tray.

According to the casing discussed above, since the base closed end is closer to the bottom surface than the distal opening and is located between the distal opening and the first pivot, the housing box can be pivoted by pivoting the handle so as to move the second side of the housing box in a direction away from the bottom surface.

In some other embodiments, the housing box is able to be pivotably disposed in the tray via the first slot and pivotable about the first pivot.

In some other embodiments, the arc path does not overlap with the bottom surface of the tray. Accordingly, while the housing box pivoted with respect to the tray, the housing box does not interfere with the bottom surface.

In some other embodiments, the guiding component has a first guide surface. The first guide surface is a continuous surface located between and connected to the distal opening and the base closed end. The first guide surface has a mild curve, allowing the pin to slide in a smooth manner.

In some other embodiments, the guiding component has a second guide surface. The second guide surface faces the first guide surface. The second guide surface is also a continuous surface located between and connected to the distal opening and the base closed end. The second guide surface has a mild curve, allowing the pin to slide in a smooth manner.

In some other embodiments, the distal opening is wider than the base closed end and the diameter of the pin. Accordingly, the pin is easy to enter the guiding component from the distal opening.

In some other embodiments, when the housing box is pivoted in the direction by the handle, and the pin is moved to the distal opening, the second side of the housing box protrudes from the top side of the tray, and the second corner is moved further away from the bottom surface than the top side. As a result, the insertion opening is in a position that is convenient for the insertion and removal of the hard disks.

In some other embodiments, the casing further includes a second pivot. The housing box is able to be disposed on the second pivot via the second slot. The second pivot, first pivot, and guiding component can support the housing box together.

In some other embodiments, the casing further includes a positioning mechanism. When the elastic component is in the released state, the elastic component forces the positioning pin to protrude from the second side surface. When the elastic component is compressed to the compressed state, the positioning pin moves with the elastic component and thus moving away from the first side surface and retreats to a position that is not protruding from the second side surface.

In some other embodiments, the handle has a first positioning hole. While the housing box is pivoted by the handle and the first positioning hole is aligned with the positioning pin, the elastic component is not pressed by the handle and thus turning into the released state so that a part of the positioning pin is able to be inserted into the first positioning hole, thereby fixing the housing box in the current position and making it unable to be pivoted with respect to the handle. Therefore, the insertion opening is held in the position convenient for the insertion and removal of the hard disks.

In some other embodiments, the handle has a second positioning hole. When the housing box is placed in the tray, the elastic component is in the released state and a part of the positioning pin is inserted into the second positioning hole, allowing the housing box is unable to be pivoted with respect to the handle. Thus, the elastic component can be compressed and returns to the compressed state so that the positioning pin is able to retreat to a position that is not protruding from the second side surface, thereby the housing box can be pivoted with respect to the handle. The positioning pin is pressed by the handle and the elastic component is still in the compressed state until the first positioning hole is aligned with the positioning pin, and the elastic component is allowed to return to the released state and a part of the positioning pin inserts into the first positioning hole. The second positioning hole is configured to ensure the housing box to remain locating in the tray.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A casing, comprising:
   a tray, having a bottom surface and a first side surface adjacent to each other;
   a first pivot, fixed on the first side surface;
   a guiding component, disposed on the first side surface, the guiding component comprising a distal opening and a base closed end, wherein the base closed end is closer to the bottom surface than the distal opening and is located between the distal opening and the first pivot;
   a housing box, comprising a first side and a second side opposite to each other, the first side pivotably disposed at the first pivot, the second side having an insertion opening, the housing box having a second side surface located between the first side and the second side;
   a handle, pivotably disposed on the second side surface, the handle comprising a hold part and a pin, wherein the guiding component is located between the hold part and the first pivot, and the pin is located at the guiding component; and
   a second pivot, fixed on the first side surface, wherein the pin is located between the first pivot and the second pivot.

2. The casing according to claim 1, further comprising a positioning mechanism disposed on the housing box, the positioning mechanism comprising a positioning pin protruding from the second side surface toward the first side surface, the handle having a first positioning hole, wherein while the handle is pivoted with respect to the second side surface, the first positioning hole is moved along a curved path, and the positioning pin is located on the curved path.

3. The casing according to claim 2, wherein the handle has a second positioning hole, a distance between the second positioning hole and the bottom surface is larger than a distance between the first positioning hole and the bottom surface, and a part of the positioning pin is inserted into the second positioning hole.

4. The casing according to claim 2, wherein the positioning mechanism further comprises an elastic component connected to the positioning pin, the elastic component has a released state and a compressed state; when the elastic component is in the released state, the elastic component forces the positioning pin to protrude from the second side surface; when the elastic component is turned into the compressed state, the elastic component is compressed away from the first side surface, and the positioning pin following the elastic component moves away from the first side surface and retreats to a position that is not protruding from the second side surface.

5. The casing according to claim 1, wherein the housing box comprises a first slot located at the first side of the housing box, the first slot comprises a first opening and a first closed end, a first inner surface of the first closed end contacts a first outer surface of the first pivot so that the housing box pivotably disposed in the tray via the first slot by taking the first pivot as a pivot center.

6. The casing according to claim 1, wherein the housing has a first corner located at the first side of the housing box and is closer to the bottom surface, while the housing box is pivoted on the first pivot, the first corner is moved along an arc path, which is not overlapping with the bottom surface.

7. The casing according to claim 1, wherein the guiding component has a first guide surface located between the distal opening and the base closed end, and the first guide surface is a continuous surface.

8. The casing according to claim 1, wherein a width of the distal opening is larger than a width of the base closed end.

9. The casing according to claim 1, wherein the housing box has a second corner located at the second side of the housing box and is closer to the bottom surface, the tray has a top side located at the first side surface away from the bottom surface, while the pin is located at the distal opening, the second corner is farther away from the bottom surface than the top side.

10. The casing according to claim 1, wherein the housing box comprises a second slot located at the second side of the housing box, the second slot comprises a second opening and a second closed end, and a second inner surface of the second closed end is in contact with a second outer surface of the second pivot so that the housing box is disposed on the second pivot via the second slot.

* * * * *